US009685555B2

(12) United States Patent
Liu et al.

(10) Patent No.: US 9,685,555 B2
(45) Date of Patent: Jun. 20, 2017

(54) HIGH-RELIABILITY, LOW-RESISTANCE CONTACTS FOR NANOSCALE TRANSISTORS

(71) Applicants: STMICROELECTRONICS, INC., Coppell, TX (US); INTERNATIONAL BUSINESS MACHINES CORPORATION, Armonk, NY (US); GLOBALFOUNDRIES Inc., Grand Cayman, KY (US)

(72) Inventors: Qing Liu, Watervliet, NY (US); Nicolas Loubet, Guilderland, NY (US); Chun-chen Yeh, Clifton Park, NY (US); Ruilong Xie, Schenectady, NY (US); Xiuyu Cai, Niskayuna, NY (US)

(73) Assignees: STMICROELECTRONICS, INC., Coppell, TX (US); GLOBALFOUNDRIES, INC., Grand Cayman (KY); INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/584,161

(22) Filed: Dec. 29, 2014

(65) Prior Publication Data
US 2016/0190325 A1 Jun. 30, 2016

(51) Int. Cl.
*H01L 29/49* (2006.01)
*H01L 29/78* (2006.01)
(Continued)

(52) U.S. Cl.
CPC .... *H01L 29/7856* (2013.01); *H01L 21/76816* (2013.01); *H01L 21/76897* (2013.01); *H01L 29/0657* (2013.01); *H01L 29/4975* (2013.01); *H01L 29/6681* (2013.01); *H01L 2029/7858* (2013.01)

(58) Field of Classification Search
CPC ........... H01L 29/7856; H01L 21/76804; H01L 29/0657; H01L 29/4975; H01L 29/6681
See application file for complete search history.

(56) References Cited

U.S. PATENT DOCUMENTS 9,024,443 B2 * 5/2015 Inaba ...................... H01L 23/52
257/758
9,196,732 B2 * 11/2015 Liaw ................ H01L 29/66795
(Continued)

*Primary Examiner* — Michael Shingleton
(74) *Attorney, Agent, or Firm* — Seed IP Law Group LLP

(57) ABSTRACT

Tapered source and drain contacts for use in an epitaxial FinFET prevent short circuits and damage to parts of the FinFET during contact processing, thus improving device reliability. The inventive contacts feature tapered sidewalls and a pedestal where electrical contact is made to fins in the source and drain regions. The pedestal also provides greater contact area to the fins, which are augmented by extensions. Raised isolation regions define a valley around the fins. During source/drain contact formation, the valley is lined with a conformal barrier that also covers the fins themselves. The barrier protects underlying local oxide and adjacent isolation regions against gouging while forming the contact. The valley is filled with an amorphous silicon layer that protects the epitaxial fin material from damage during contact formation. A simple tapered structure is used for the gate contact.

22 Claims, 10 Drawing Sheets

(51) Int. Cl.
  *H01L 29/66* (2006.01)
  *H01L 29/06* (2006.01)
  *H01L 21/768* (2006.01)

(56) References Cited

U.S. PATENT DOCUMENTS

2014/0061929 A1* 3/2014 Inaba ...................... H01L 23/52
                                                             257/762
2014/0300005 A1* 10/2014 Di Franco ......... H01L 21/76801
                                                             257/774
2015/0235946 A1* 8/2015 Bonilla ............... H01L 23/5226
                                                             257/758

* cited by examiner

HIGH-RELIABILITY, LOW-RESISTANCE CONTACTS FOR NANOSCALE TRANSISTORS

BACKGROUND

Technical Field

The present disclosure generally relates to FinFETs and, in particular, to lowering contact resistance in a FinFET, while reducing the probability of short circuits between adjacent contacts.

Description of the Related Art

Forming electrical contacts to the terminals of integrated circuit transistors becomes more challenging as the transistors become smaller and more complex. Nanoscale transistor designs such as fin field effect transistors (FinFETs) pose new challenges to circuit designers in positioning adjacent structures that are prone to developing short circuits. Because they tend to be intermittent, short circuits are more likely to cause reliability failures rather than functional test failures. Structures prone to developing short circuits include corners of metal interconnect lines and electrical contacts that are in close proximity to one another, especially when transistor dimensions are at or below 20 nm. To prevent short circuits between contacts, metal lines can be angled or corners can be rounded, for example. Alternatively, short circuit prevention can be provided for some structures by making changes in the fabrication process for conducting features.

Controlling contact resistance poses another challenge to designers of nanoscale circuits. As the contact area shrinks, the associated contact resistance increases according to the relationship $R=\rho_c l/A$, wherein A is the contact surface area at the point of contact through which current flows, l is the height of the contact in the direction of current flow, and $\rho_c$ is the resistivity of the contact metal. Increases in contact resistance significantly degrade overall device performance. Thus, it is important to address and compensate for the increased contact resistance that occurs with each new technology generation by making changes in the transistor design, the contact design, or the transistor fabrication process.

BRIEF SUMMARY

Tapered source and drain contacts for use in epitaxial transistors can reduce short circuits and prevent damage to neighboring regions during contact processing, thus improving device reliability. A high-reliability contact for use in nanoscale transistor designs features tapered sidewalls that spread out at the base of the contact to form an enlarged pedestal where electrical contact is made to fins in the source and drain regions. The pedestal provides greater contact area at the fins, thus reducing contact resistance. Raised isolation regions form a valley around the fins.

During source/drain contact formation, the bottom and sides of the valley, and the fins themselves, are lined with a conformal silicon nitride barrier. Then, the valley is filled with an amorphous silicon layer. The silicon nitride barrier protects underlying local oxide and adjacent isolation regions against gouging while forming the contact. The amorphous silicon layer protects the epitaxial fin material from damage during contact formation. A simple tapered structure is used for the gate contact.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale.

FIGS. 3A-6C illustrate a process for forming an inventive semiconductor FinFET device having high-reliability, low-resistance contacts, according to one embodiment.

FIGS. 3A-3C show an embodiment of a partially formed FinFET on a silicon substrate, the FinFET including fins, a dummy gate, and raised isolation regions.

FIGS. 6A-6C show one embodiment of a completed FinFET after the source/drain and gate contacts have been filled.

DETAILED DESCRIPTION

Figure 1:
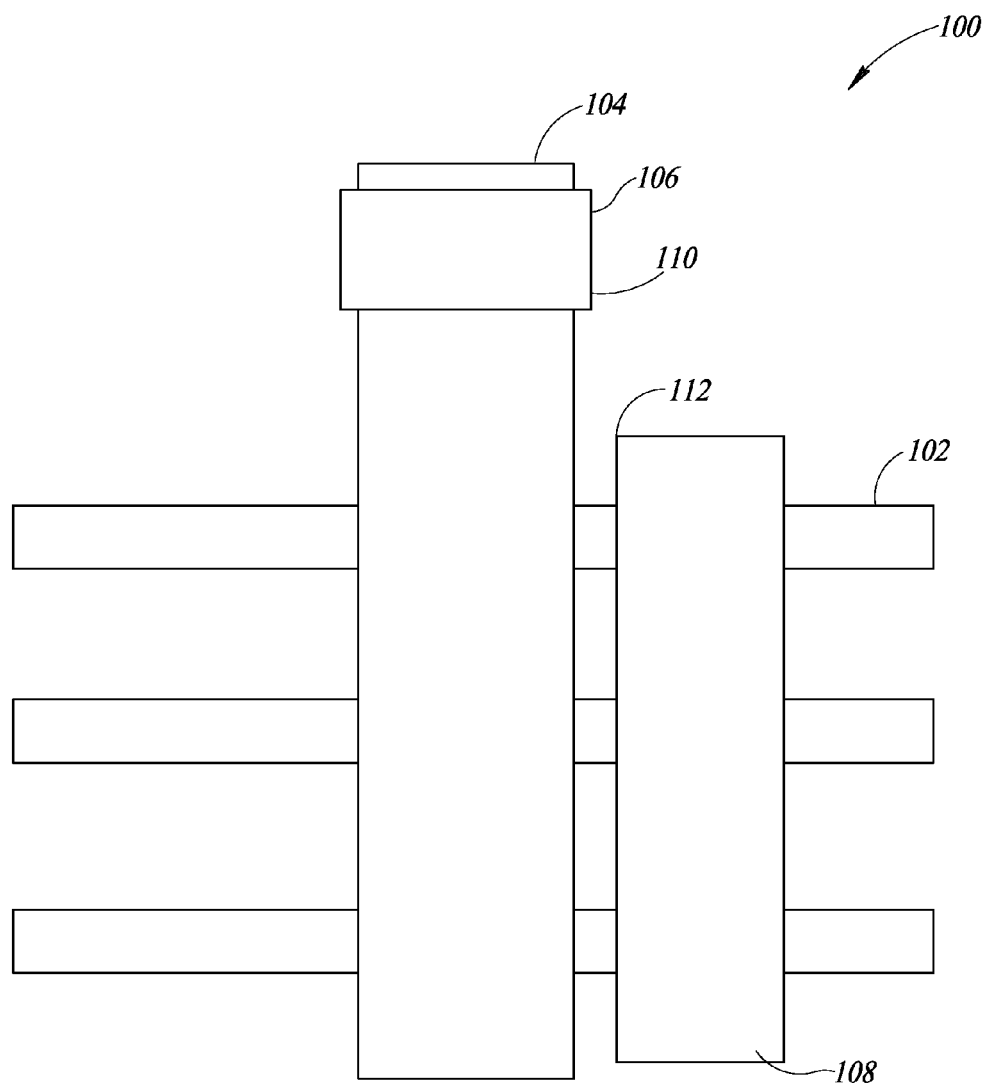
FIG. 1 is a top plan view of an existing layout of electrical contacts for a FinFET, according to the prior art.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like and one layer may be composed of multiple sub-layers.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask (e.g., a silicon nitride hard mask), which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to FinFETs that have been produced; however, the present disclosure and the reference to certain materials, dimensions, and the details and ordering of processing steps are exemplary and should not be limited to those shown.

Turning now to the figures, FIG. 1 shows a top plan view of an existing FinFET design 100 on a silicon substrate. The FinFET design 100 includes three fins 102, a metal gate 104, a gate contact 106, and a source/drain contact 108. The source/drain contact 108 forms an electrical connection to a region of epitaxial silicon that acts as a charge reservoir for the transistor. Portions of the fins 102 underlying the metal gate 104 serve as the current-carrying channels for the transistors. Portions of the fins 102 on either side of the metal gate 104 are coupled to source and drain regions underlying the source/drain contact 108. The source/drain contact 108 bridges all of the fins 102, and extends beyond the fins 102 to allow for some margin of error in alignment of a contact lithography mask for establishing a pattern of electrical contacts with respect to the fins 102. Depending on the particular design layout, a gate contact corner 110 may be close enough to an adjacent source/drain contact corner 112 that there is a risk of a short circuit forming between the two contacts. For this reason the gate contact 106 is positioned as far away as possible from the fins 102. Because the contacts are so closely spaced, the fins 102 are prone to damage during the contact etch process.

Figure 2:
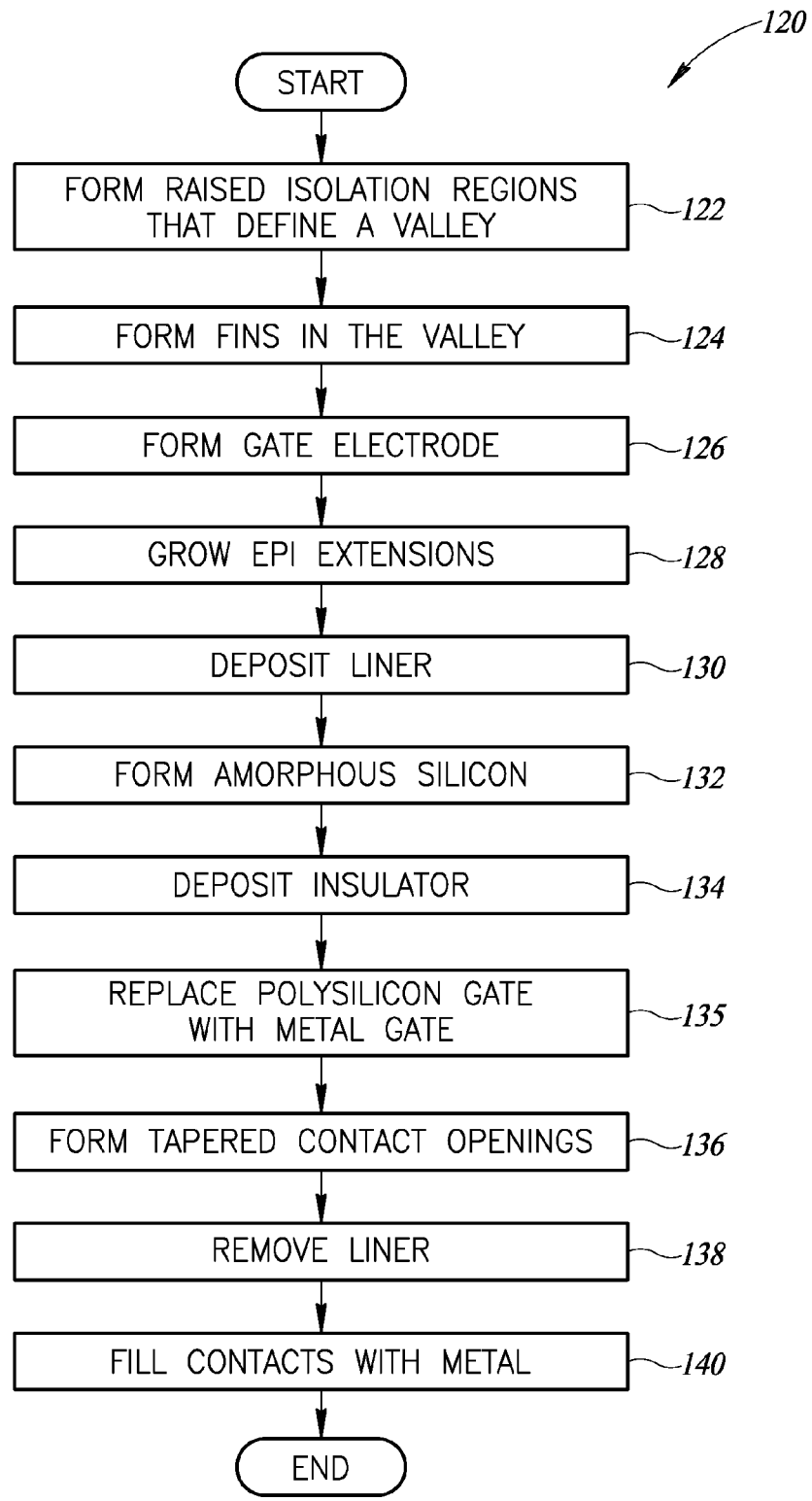
FIG. 2 is a flow diagram summarizing a processing sequence for fabricating a FinFET with high-reliability, low-resistance contacts, according to one exemplary embodiment described herein.

FIG. 2 shows an exemplary sequence of steps in a method 120 of fabricating FinFETs having tapered source/drain contacts, according to one embodiment. The tapered source/drain contacts reduce the risk of a short circuit to the gate contact 106. The process shown and described may make use of techniques for nanoscale fin formation, e.g., a self-aligned sidewall image transfer (SIT) process, and gate formation, e.g., a replacement metal gate process, which techniques are known and therefore are not explained herein in detail.

The steps 122-140 for fabricating high-reliability, low-resistance FinFET contacts are described further below, with reference to FIGS. 3A-6C. In each set of FIGS. A-C, A is a top plan view showing the FinFET gate electrode in a transverse orientation with respect to the fins; B is a cross-sectional schematic view at a cut line X-X through the gate region, along a particular fin; and C is a cross-sectional view at a cut line Y-Y through a source/drain region, across a plurality of fins, adjacent to the gate region. In accordance with convention, arrows on each cut line represent the direction of an observer's eye looking at the corresponding cut plane.

Figure 3A:
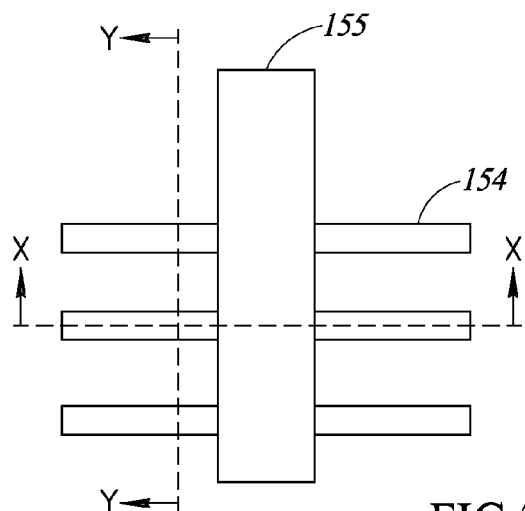
Figure 3B:
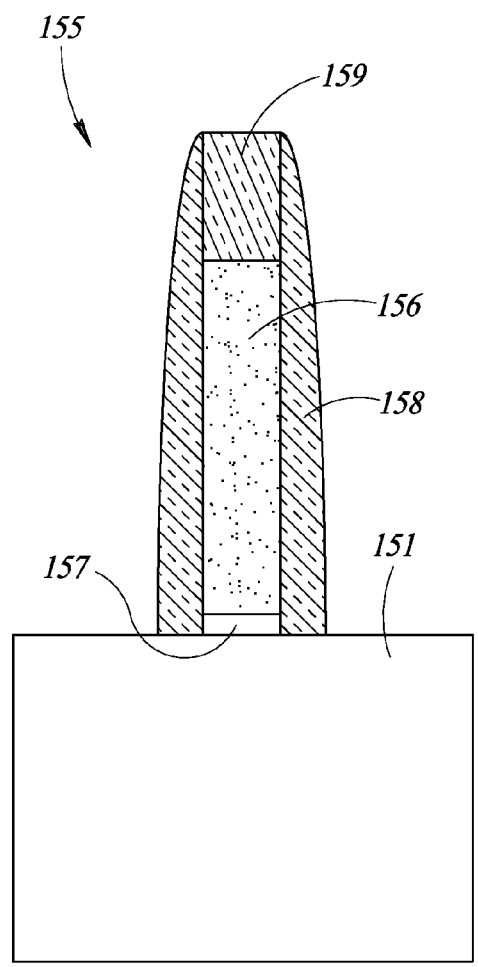
Figure 3C:
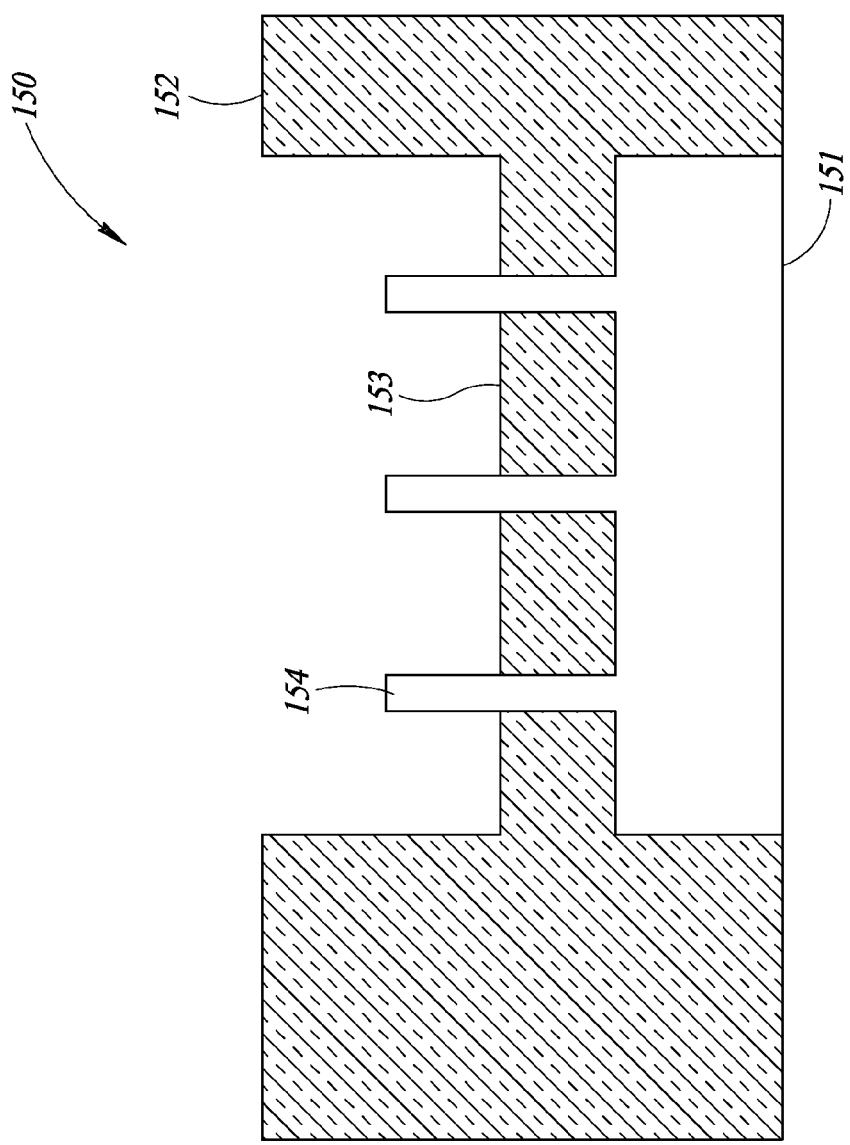

FIGS. 3A-3C show a partially formed FinFET 150 on a silicon substrate 151, according to one embodiment. The partially formed FinFET 150 has raised isolation regions 152, fins 154, and a dummy gate 155.

At 122, the raised isolation regions 152 are formed to define a valley 153 that will accommodate the FinFET 150. The raised isolation regions 152 are made of $SiO_2$ and can be formed according to any suitable process known in the art of semiconductor fabrication.

At 124, the fins 154 are formed in the valley 153 by epitaxial growth extending about 40-60 nm from a surface of the silicon substrate 151. Three elongated fins 154 are shown in the valley 153, however more or fewer fins can be formed in the valley 153 in other embodiments.

Alternatively, the fins 154 can be formed first at step 122, and then at step 124 the valley 153 can be defined around the fins, according to another exemplary embodiment. For example, a full array of fins 154 initially can be patterned on the substrate 151 using a thin SiN hard mask. Then, spaces between the fins 154 are filled with oxide to cover the fins 154 completely, and the oxide is planarized to stop on the thin SiN hard mask. The oxide formation is then followed by formation of a thick SiN layer, in the range of about 30-40 nm. Next, the thick SiN layer is patterned using a standard photoresist mask to form a hard mask for the valley 153. That is, the thick SiN layer is masked in the center to protect the underlying fins 154 that are to be retained, while the SiN layer is removed on either side of the valley 153. At the same time that the SiN is removed, the extraneous fins can also be removed, along with non-active regions of the substrate 151 located outside the valley 153, using an anisotropic, low selectivity etching process. The non-active regions outside the valley 153 are then over-filled with oxide to form the raised isolation regions 152. The raised isolation regions 152 remain in place as the SiN protective mask overlying the valley 153 and the original thin SiN hard mask are removed together. The SiN can be removed by for example, a hot phosphoric acid wet etch that attacks SiN while leaving behind the $SiO_2$ raised isolation regions 152. Finally, the oxide between the fins 154 is partially removed down to the surface of the valley 153, revealing the retained fins 154. The oxide removal step that reveals the fins 154 can be carried out using a isotropic etch that is highly selective to silicon, e,g, a hydrofluoric acid dip. Other embodiments in which fins are formed in a valley surrounded by isolation regions can be substituted for either one of the processing sequences described above with respect to steps 122 and 124.

At 126, a gate electrode 155 is formed including a polysilicon gate 156, a gate dielectric 157, silicon nitride sidewall spacers 158, and a silicon nitride cap 159. The polysilicon gate 156 and the gate dielectric 157 are temporary layers that will be replaced during a subsequent step.

Figure 4A:
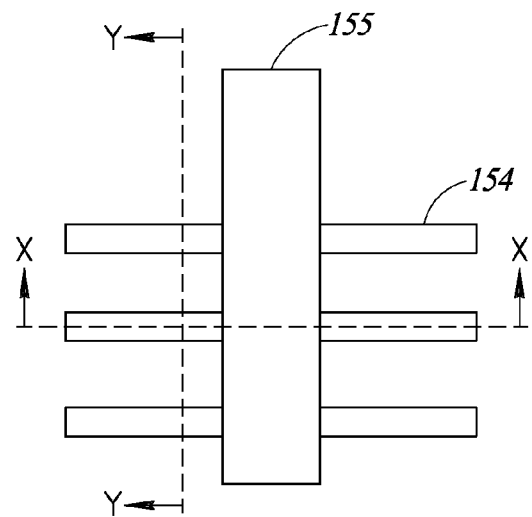
FIGS. 4A-4C show one embodiment of a partially formed FinFET after carrying out a replacement metal gate process and following formation of un-merged epitaxial extensions.
Figure 4B:
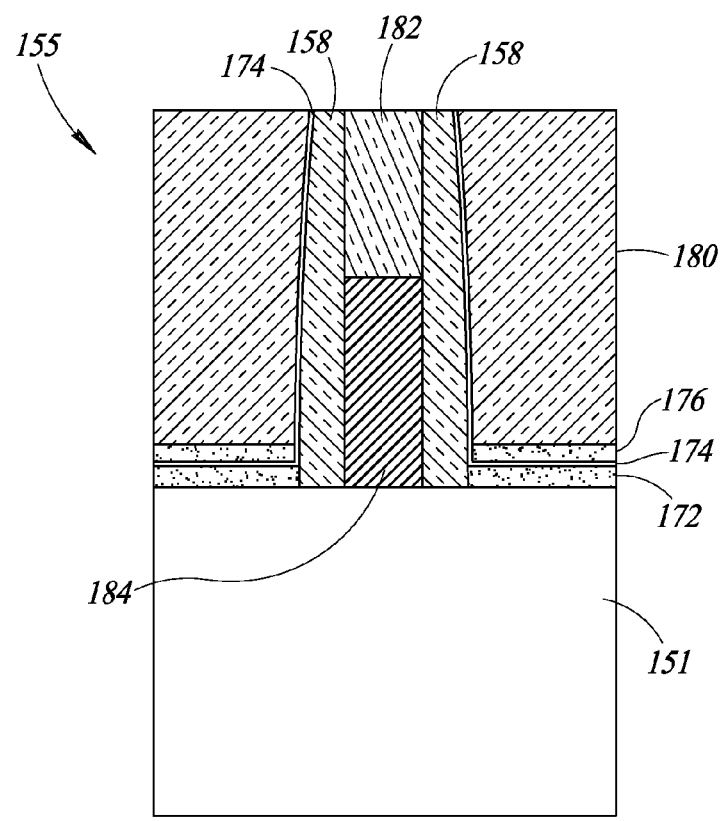
Figure 4C:
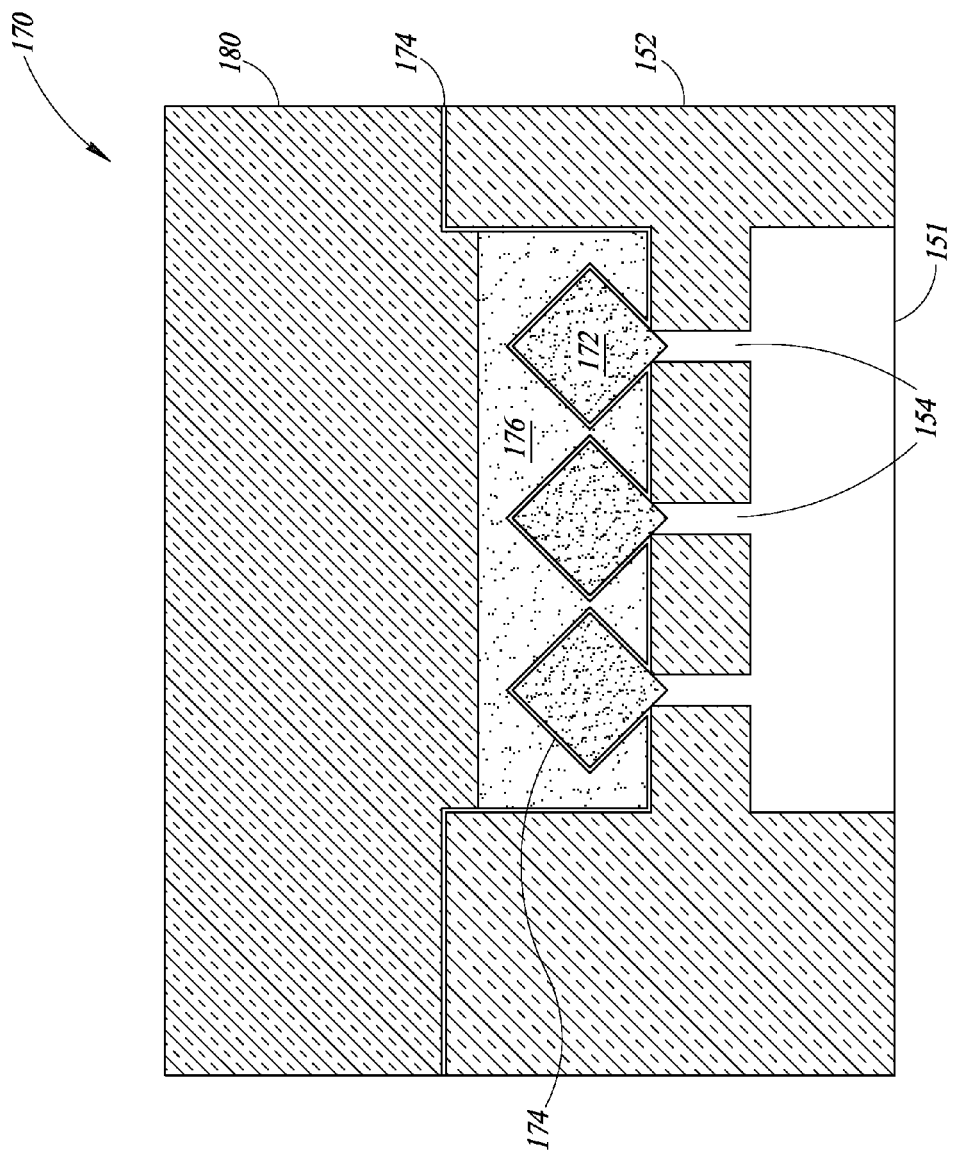

FIGS. 4A-4C show one embodiment of a partially formed FinFET 170 after carrying out a replacement metal gate process and following formation of un-merged epitaxial extensions.

At 128, epitaxial extensions 172 of the fins are formed in the source/drain regions by epitaxial growth outward from the fins 154. The epitaxial extensions 172 can be made of, for example, doped silicon or silicon germanium to provide charge reservoirs for the device. The epitaxial extensions 172 have diamond-shaped profiles in the example shown, but in general, profiles of the epitaxial extensions 172 can have a variety of different shapes. For example, the epitaxial extensions 172 can be shaped like cubes, ovals, ellipsoids, prismatic shapes, shapes having a corrugated surface, or any number of acceptable shapes, and do not need to be diamond-shaped as shown in FIG. 4C. The epitaxial extensions 172 do not merge together, but remain un-merged, or spaced apart from one another by a gap that is at least a few nm wide. In the gate region (FIG. 4B), epitaxial growth results in planar layers being formed on a top surface of the silicon substrate 151. The epitaxial extension 172 serves to increase the electrical contact area to the fins by a factor of about 10-12.

At 130, a protective liner 174 is conformally deposited over the surface of the valley 153, the epitaxial extensions 172, and the raised isolation regions 152. The liner 174 is made of silicon nitride (SiN), in the range of about 3-10 nm thick. In the gate region, the liner 174 conformally covers the planar layers and the gate electrode 155.

At 132, the valley 153 is filled with amorphous silicon 176 to encapsulate the epitaxial extensions 172. The amorphous silicon 176 is positioned so as to isolate the epitaxial extensions 172 from effects of the subsequent ILD etching process described below. The amorphous silicon 176 may not fill completely the regions between the epitaxial extensions 172, leaving voids therein. Incomplete fill is acceptable because the amorphous silicon 176 is also a sacrificial layer. A top surface of the amorphous silicon 176 is then recessed below the liner 174 by about 10 nm. In the gate region (FIG. 4B) the amorphous silicon 176 forms a planar layer on top of the liner 174.

At 134, a thick, insulating inter-layer dielectric (ILD) 180, e.g., silicon dioxide ($SiO_2$) or a low-k ILD is formed in contact with the amorphous silicon 176 and the liner 174. The ILD 180 is planarized, using the polysilicon gate 156 as a stop layer. During planarization, the cap 159 is removed, along with top portions of the sidewall spacers 158.

At 135, the polysilicon gate 156 and the gate dielectric 157 are replaced by a metal gate 182 and a high-k gate dielectric 184, respectively, according to a replacement metal gate process as is known in the art. The metal gate 182 can be made of tungsten (W), for example, or a metal stack including tungsten and a work function metal.

Figure 5A:
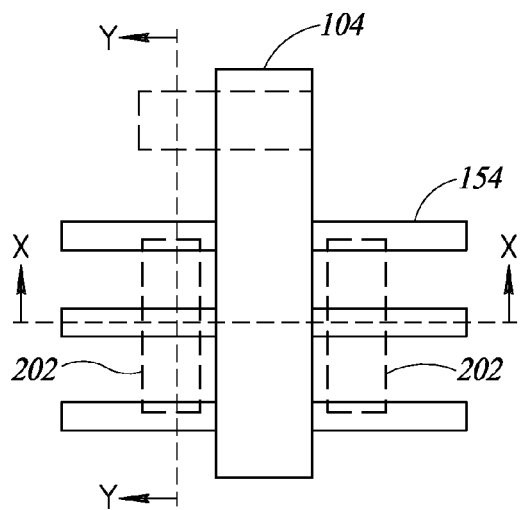
FIGS. 5A-5C show one embodiment of a partially formed FinFET after forming source/drain contact openings.
Figure 5B:
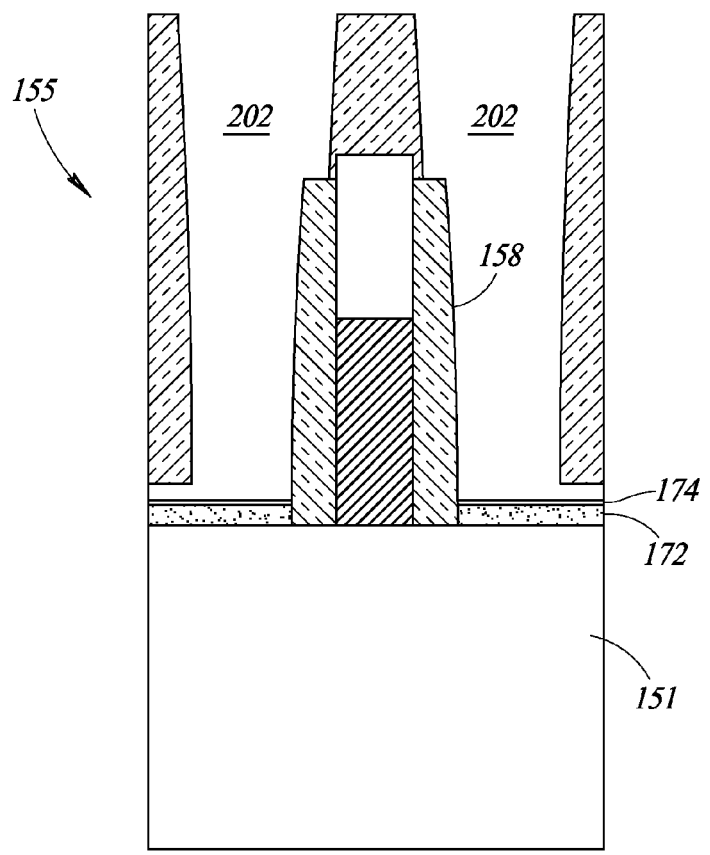
Figure 5C:
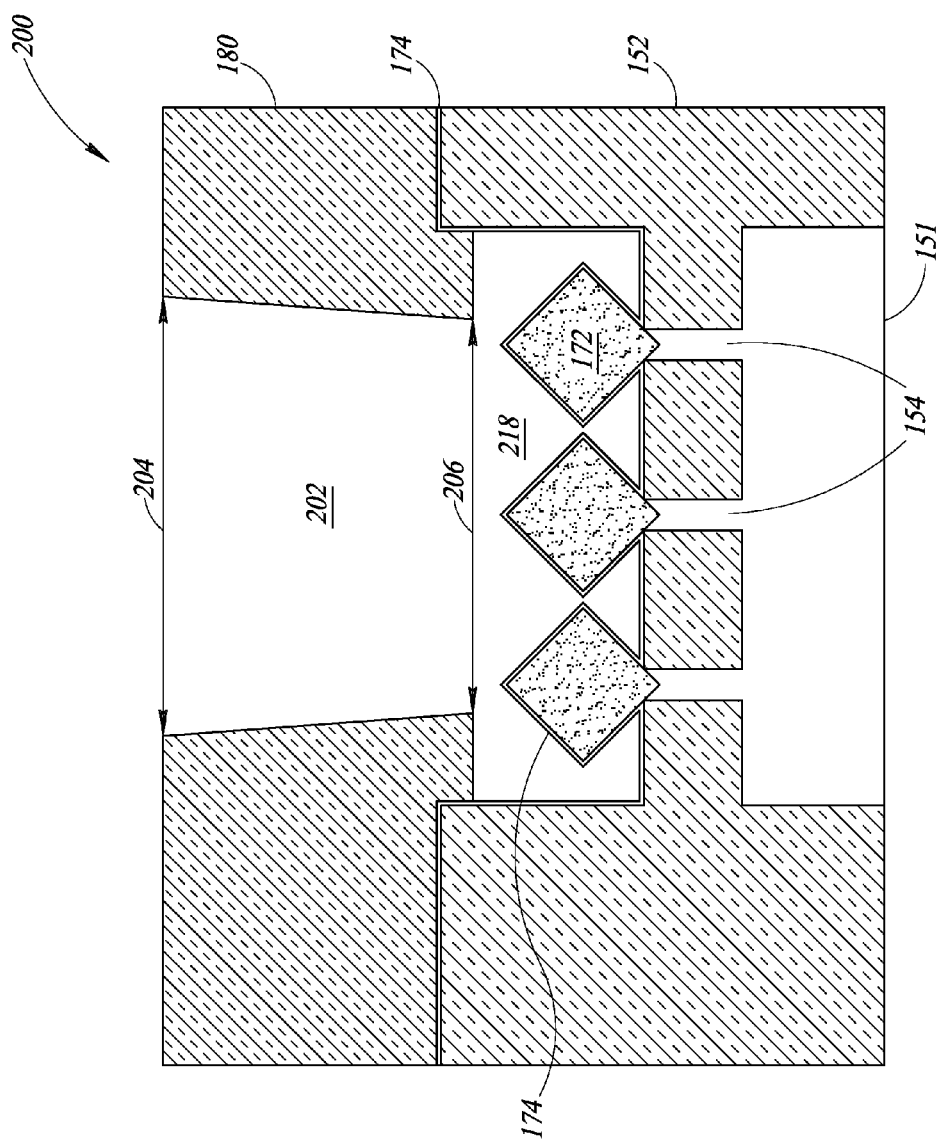
Figure 6A:
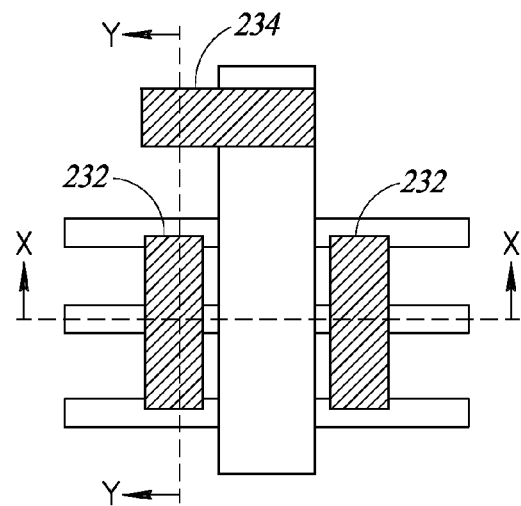

FIGS. 5A-5C show one embodiment of a partially formed FinFET 200 after forming source/drain contact openings 202. Footprints of the source/drain and gate contact openings are indicated in FIG. 6A by dashed lines. The footprint areas are about 10-20 nm wide×50-100 nm long.

At 136, tapered contact openings 202 are formed using, for example, a two-step etch process: in a first step, a reactive ion etch (RIE) process etches the ILD 180 anisotropically, in a downward vertical direction, to form a tapered column having a top surface width 204, a bottom surface width 206, and sidewalls that slope inward from the top surface. The RIE for ILD removal is a high-power, mechanically harsh process that uses ion bombardment to eject chunks of the ILD 180. In the inventive method, the RIE stops on the amorphous silicon 176 so as not to damage the epitaxial extensions 172. The SiN liner 174 may further protect the epitaxial extensions 172 from damage during the contact etch process.

The RIE can be followed by a second step that uses an isotropic etchant, e.g., a wet chemical etchant, to more gently remove the amorphous silicon. Thus is formed an enlarged pedestal opening 218 at the bottom of the tapered column, the enlarged pedestal opening 218 having a width that is wider than the top surface width 204. The isotropic etchant attacks the amorphous silicon 176, selective to the SiN liner 174 and the silicon nitride sidewall spacers 158. In the gate region (FIG. 5B) the planar layer of amorphous silicon is removed, undercutting the ILD 180.

The electrical contact area provided by the epitaxial extensions 172 is about 10-15 times greater than the surface area of the fins without the extensions. The enlarged pedestal opening 218 will allow the electrical contact to access this larger surface area while maintaining a small footprint, 206, on the contact mask.

Figure 6B:
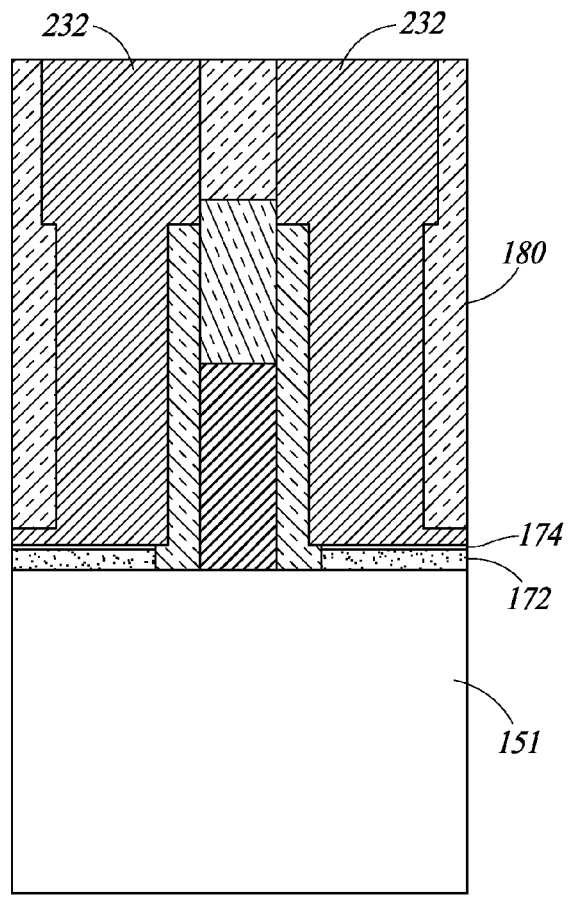
Figure 6C:
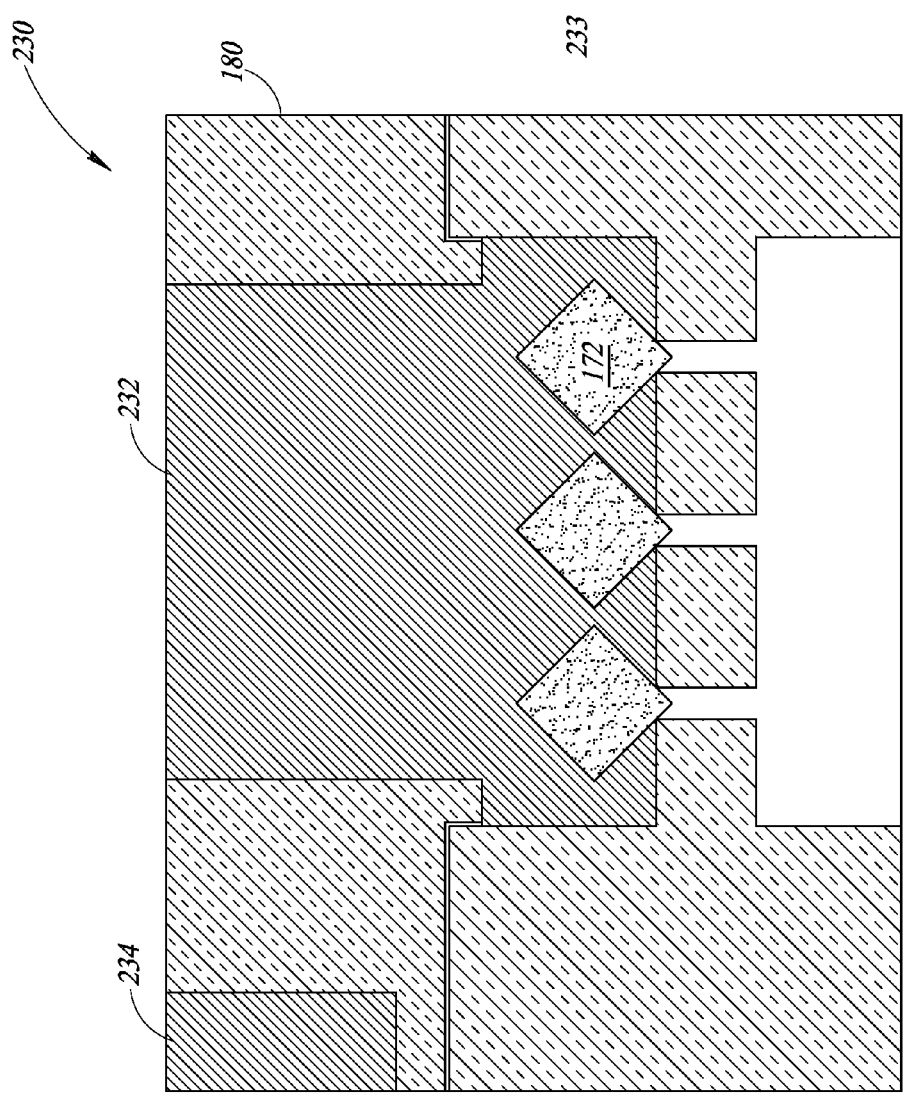

FIGS. 6A-6C show one embodiment of a completed FinFET 230 after the source/drain and gate contacts have been filled.

At 138, the liner 174 is removed, for example, using a wet chemical etchant such as hot phosphoric acid that attacks SiN selective to both silicon and oxide. Thus, the liner 174 is gone in FIGS. 6B and 6C, while the epitaxial extensions 172 and the ILD 180 remain intact.

At 140, the tapered source/drain contact openings 202 are filled with a contact metal to form a tapered source/drain contact structure. The contact metal can be, for example, copper, aluminum, tungsten, silver, titanium, titanium nitride, or any other metal, metal alloy, metal stack, or other combinations thereof suitable for interconnections among FinFET devices. A first layer of the contact metal can be a thin layer that reacts with the epitaxial extensions 172 to form a silicide as is known in the art. The contact metal fills the valley 153 and the contact openings 202 to form source/drain contacts 232. A lower portion of the source/drain contacts 232 in the valley 153 forms a bottom pedestal 233. Gate contacts 234 are formed in a similar manner, and can be tapered, and filled in the same step as the source/drain contacts 232. The bottom pedestal 233 provides increased contact area to the epitaxial extensions 172. But, by tapering the source/drain contacts 232 down to a depth below the gate contact 234, the risk of creating a short circuit between the gate contact and the source/drain contact is reduced.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An apparatus, comprising:
   a tapered vertical column containing a conducting material, the tapered vertical column including a top surface having a top surface width, and sidewalls that slope inward from the top surface; and
   an enlarged pedestal formed in a valley at a lower end of the tapered vertical column, the pedestal at least partially filled with the conducting material, the conducting material underlying and in direct contact with at least a portion of an epitaxial semiconductor region, the pedestal having a pedestal width that is wider than the top surface width, and the epitaxial semiconductor region including one or more of doped silicon or silicon germanium.

2. An apparatus, comprising:
   a tapered vertical column containing a conducting material, the tapered vertical column including a top surface having a top surface width, and sidewalls that slope inward from the top surface;
   an enlarged pedestal formed in a valley at a lower end of the tapered vertical column, the pedestal at least partially filled with the conducting material abutting and in direct contact with a region of epitaxial semiconductor material, the pedestal having a pedestal width that is wider than the top surface width, the epitaxial semiconductor material including one or more of doped silicon or silicon germanium;
   a substrate and a plurality of fins that extend from the substrate into the valley;
   a gate electrode overlying the fins in a transverse orientation; and
   a gate contact coupled to a top surface of the gate electrode.

3. The apparatus of claim 2 wherein the fins include epitaxial extensions that increase a fin contact surface area.

4. The apparatus of claim 2, further comprising a silicide layer in contact with one or more surfaces of the fins.

5. The apparatus of claim 2 wherein the fins are arranged substantially parallel to one another.

6. The apparatus of claim 1 wherein the pedestal is located adjacent to raised isolation regions containing an insulating material.

7. The apparatus of claim 1 wherein the conducting material includes one or more of tungsten, copper, silver, aluminum, titanium, titanium nitride, or combinations thereof.

8. The apparatus of claim 2 wherein
   each fin includes a source region, a drain region, and a channel region coupling the source and drain regions, and
   the gate electrode covers the channel regions of the fins.

9. The apparatus of claim 3 wherein the epitaxial extensions have diamond-shaped profiles.

10. An apparatus, comprising:
    a silicon substrate;
    isolation regions in the silicon substrate, the isolation regions having raised portions;
    an array of semiconducting fins between the raised portions, the fins being substantially parallel to one another and extending above the silicon substrate;
    a gate electrode overlying the array of semiconducting fins; and
    tapered contacts to the fins, the tapered contacts having
       a top surface having a top contact width,
       a bottom surface, and
       sidewalls that slope inward from the top surface to the bottom surface.

11. The apparatus of claim 10, further comprising epitaxial extensions from the semiconducting fins.

12. The method of claim 11 wherein the epitaxial extensions are spaced apart from one another.

13. The method of claim 11 wherein the epitaxial extensions increase a fin contact area by at least a factor of 10.

14. The apparatus of claim 10, further comprising a protective liner covering the fins.

15. The method of claim 14 wherein the protective liner is made of silicon nitride.

16. The apparatus of claim 10, further comprising an encapsulant covering the fins.

17. The apparatus of claim 16 wherein the encapsulant is made of amorphous silicon.

18. The apparatus of claim 10, further comprising an insulating layer above the fins.

19. The apparatus of claim 10 wherein the tapered contacts include a bottom pedestal having a pedestal width that exceeds the top contact width.

20. A device comprising:
    a semiconductor substrate;
    a fin including a source region, a drain region, and a channel extending between the source and drain regions;
    a gate overlying the fin in a transverse orientation to the fin; and
    contacts to the source region, the drain region, and the gate, at least one of the contacts including:
    a tapered vertical column containing a conducting material, the tapered vertical column including a top surface having a top surface width, and sidewalls that slope inward from the top surface; and
    an enlarged pedestal formed in a valley at a lower end of the tapered vertical column, the pedestal at least partially filled with the conducting material abutting and in direct contact with a region of epitaxial semiconductor material, the pedestal having a pedestal width that is wider than the top surface width.

21. The apparatus of claim 1 wherein the pedestal includes at least one void region that is not filled with the conducting material.

22. The device of claim 20 wherein the pedestal includes at least one void region that is not filled with the conducting material.

* * * * *